United States Patent
Chan et al.

(10) Patent No.: US 7,726,239 B2
(45) Date of Patent: Jun. 1, 2010

(54) CONTROLLED DEPOSITION OF PRINTING MATERIAL

(75) Inventors: FoongYow Chan, Malayasia (MY); Rahmat Hashim, Malaysia (MY); SeongPeng Au, Singapore (SG); Kok Chin Lee, Malaysia (MY)

(73) Assignee: Seagate Technology LLC, Scotts Valley, CA (US)

( * ) Notice: Subject to any disclaimer, the term of this patent is extended or adjusted under 35 U.S.C. 154(b) by 650 days.

(21) Appl. No.: 11/210,412

(22) Filed: Aug. 24, 2005

(65) Prior Publication Data

US 2007/0051255 A1   Mar. 8, 2007

(51) Int. Cl.
   *B41M 1/12*   (2006.01)
(52) U.S. Cl. .................. 101/129; 101/123
(58) Field of Classification Search ........... 101/114, 101/123, 124, 127, 128.21, 129
   See application file for complete search history.

(56) References Cited

U.S. PATENT DOCUMENTS

| | | | |
|---|---|---|---|
| 5,681,387 A | 10/1997 | Schmidt | |
| 5,704,286 A * | 1/1998 | Takashima | 101/127 |
| 5,713,276 A | 2/1998 | Teoh | |
| 5,724,889 A | 3/1998 | Aun | |
| 5,746,127 A | 5/1998 | Fischbeck | |
| 5,813,331 A | 9/1998 | Tan | |
| 5,878,661 A | 3/1999 | Glovatsky | |
| 5,887,312 A | 3/1999 | Curtin | |
| 5,947,021 A | 9/1999 | Coleman | |
| 5,988,856 A * | 11/1999 | Braunstein et al. | 700/160 |
| 5,991,963 A | 11/1999 | Tourigny | |
| 6,095,041 A * | 8/2000 | Comino et al. | 101/127 |
| 6,145,735 A | 11/2000 | Mallery | |
| 6,267,818 B1 | 7/2001 | Volpe | |
| 6,352,026 B1 * | 3/2002 | Murakami | 101/127 |
| 6,453,809 B2 | 9/2002 | Kempen | |
| 6,900,393 B1 * | 5/2005 | Cachina et al. | 174/260 |

\* cited by examiner

*Primary Examiner*—Ren Yan
(74) *Attorney, Agent, or Firm*—McCarthy Law Group

(57) ABSTRACT

Controlled depositing of a printing material on a substrate is provided. A stencil is disposed adjacent to the substrate. The stencil includes a number of apertures to allow printing material to pass therethrough. Printing material is deposited onto and spread across the stencil with a squeegee blade. To increase the volume of printing material over a set of selected apertures, the squeegee blade includes a printing edge having a profile feature.

18 Claims, 4 Drawing Sheets

CONTROLLED DEPOSITION OF PRINTING MATERIAL

FIELD

The claimed invention relates generally to depositing printing material onto a substrate. More particularly, the claimed invention relates to a method and apparatus for increasing the deposition of printing material in a miniaturized semiconductor component and printed circuit board (PCB) environment.

BACKGROUND

In general, the greater the number of circuit components that may be placed on a chip, the better the performance. Thus, the density of integrated circuit components in a semiconductor device is closely related to the processing speed of the device. To improve the density, researchers are constantly striving to develop semiconductor chip designs that allow for a decrease in the space between circuit components. Unfortunately, as semiconductor chips become more compact, they also become much more delicate to manufacture and handle.

In most computer systems, these state of the art fine pitch semiconductor chips are mounted to and supported by PCBs. Examples of PCBs include motherboards, graphics, video, and local area network cards. PCBs are also used to support conventional electronic components, such as connectors, capacitors, resistors, and diodes.

Unlike semiconductor chips however, these "old technology" or large pitch electronic components have not been miniaturized, primarily because the components must remain large enough to be installed, removed, or otherwise manipulated by human hands. In addition, connectors must meet agreed upon industrial standards to ensure compatibility between parts manufactured by different parties.

One method for attaching chips and electronic components to the PCB involves the use of printing material or a conductive paste, such as solder paste. In a process commonly referred to as stencil or screen-printing, the paste is deposited or printed onto the PCB through a stencil having a number of apertures in a pre-designed pattern. The stencil is positioned above the PCB so that each aperture exposes areas on the PCB pad intended to receive the paste. After the solder paste is deposited onto the stencil, a squeegee assembly having a squeegee blade is used to push the paste across the surface of the stencil. The blade is typically formed from either polyurethane or metal.

During the printing of the solder paste, the squeegee blade is pressed by the squeegee assembly into contact with and dragged across the surface of the stencil. In some assemblies, the movement of the blade may be controlled not only by direction and speed, but also by rotation and stroke length. The motion of the blade forces the paste through each aperture to print onto the PCB. Because the paste is still wet after it has been deposited onto the PCB, electrical components are easily mounted onto the PCB to complete the circuit design. Finally, the PCB undergoes a reflow process, during which the solder paste is heated and melted to form solder joints.

One of the problems with the previous printed circuit board assembly (PCBA) process is that it is difficult to deposit the right amount of solder paste for all of the different components supported by a PCB. As described above, with the advance of semiconductor technology, not only are chip designs becoming more and more compact, space between the components on a PCB is also rapidly diminishing.

If too much paste is deposited, it may result in a short circuit between nearby components on the PCB. On the other hand, if not enough paste is deposited, the component may not be properly secured to the PCB when it is mounted. Either of these conditions will lead to a greater probability of error, which is conventionally measured by defect parts per million (DPPM).

Because the amount of solder paste depends on the volume of each stencil aperture (length multiplied by width and depth), solder paste volume could traditionally be controlled, simply by varying the width of a stencil aperture. Unfortunately, to achieve satisfactory results for the fine pitch printing required by state of the art components, this method is ineffective. If the width of an aperture is too small relative to its depth, solder paste may stick to aperture walls instead of depositing onto the PCB, resulting in inadequate solder deposit.

Another method of reducing solder paste volume is to decrease the depth of the aperture by reducing the thickness of the stencil. However, in contrast with changing the width of a single aperture, changing the thickness of the stencil would necessarily change the depth of all other apertures on the stencil. If the thickness of a stencil is reduced to accommodate fine pitch components, then it is likely that the stencil will not be able to print enough solder paste to secure large pitch components.

As described previously, there is a tremendous size difference between the largest pitch components and the smallest pitch components that must be mounted on a single PCB. For example, connector pads and capacitor pads have a relatively large surface area from about 10,000 mils$^2$ to about 25,000 mils$^2$. In contrast, the surface area of quad flat packages (QFP) and synchronous dynamic random access memory (SDRAM) pads currently range only from about 300 mils$^2$ to about 600 mils$^2$.

It may be possible to overcome the size difference between the different electrical components by using more than one stencil. However, to avoid complicating the process and incurring extreme costs (e.g. requiring the use of an additional printing machine), it is extremely important for the PCBA process to deposit adequate solder paste volume within a single operation.

In view of the foregoing, it is desirable to have a method and apparatus for increasing solder deposition without increasing the thickness of a stencil. It is also desirable to selectively increase solder deposition while reducing the thickness of a stencil to reduce defects during fabrication of PCBs.

SUMMARY

The claimed invention solves the above-mentioned problems by providing for an apparatus and method for increasing the deposition of printing material. It should be appreciated that the claimed invention can be implemented in numerous ways, including as a process, an apparatus, a system, a device or a method. Several inventive embodiments of the present invention are described below.

In some embodiments of the present invention, a method for depositing a printing material on a substrate is provided. The method begins by providing a stencil disposed adjacent to the substrate. The stencil includes a number of apertures to allow printing material to pass therethrough. Printing material is deposited onto and spread across the stencil with a squeegee blade. To increase the volume of printing material over a set of selected apertures, the squeegee blade includes a printing edge having a profile feature. The increased printing material then passes through the set of selected apertures to deposit onto the substrate.

In other embodiments of the present invention, a printing system is provided. The printing system includes a stencil disposed adjacent to a substrate. The stencil includes a number of apertures to allow printing material to pass therethrough. A dispenser is used to deposit the printing material onto the stencil. The printing system also includes a squeegee blade having a printing edge with a profile feature, which is used to spread printing material onto the stencil. The profile feature is used to increase a volume of the printing material deposited onto the substrate through a set of selected apertures.

In yet other embodiments of the present invention, a squeegee assembly for depositing a printing material on a fine pitch stencil is provided. The assembly includes a squeegee blade holder for securing a squeegee blade to a printing system. The squeegee blade includes a printing edge having a profile feature to increase the volume of the printing material deposited onto the fine pitch stencil over a set of selected apertures.

These and various other features as well as advantages which characterize the claimed invention will be apparent upon reading of the following detailed description and review of the associated drawings.

DETAILED DESCRIPTION

A method and apparatus for increasing printing material deposition are provided. In the following description, numerous specific details are set forth in order to provide a thorough understanding of the claimed invention. It will be understood, however, to one skilled in the art, that the claimed invention may be practiced without some or all of these specific details. In other instances, well known process operations have not been described in detail in order not to unnecessarily obscure the claimed invention.

Figure 1:
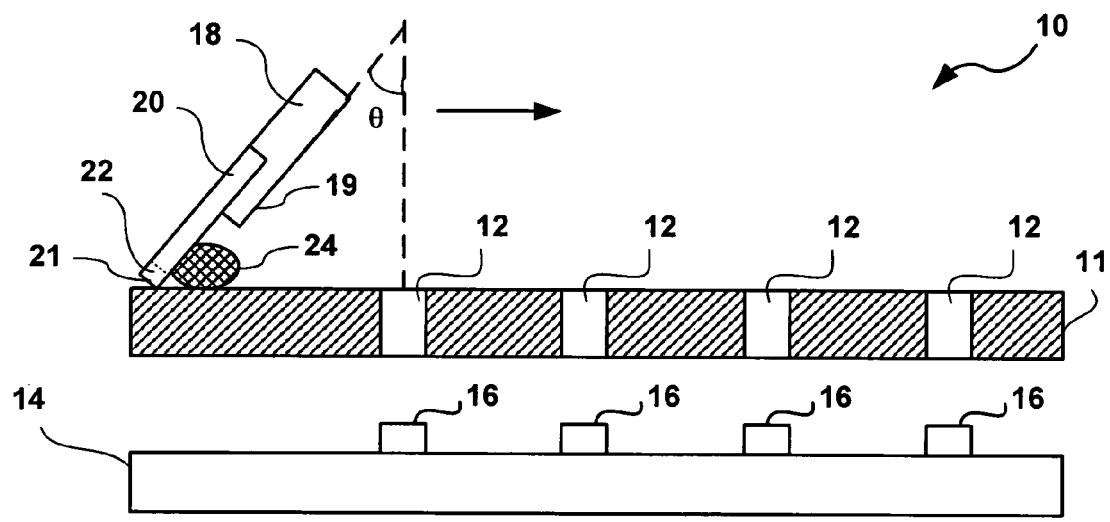
FIG. 1 illustrates a side cross-section of a printing system in accordance with embodiments of the present invention.

FIG. 1 illustrates a side cross-section of a printing system 10 in accordance with embodiments of the present invention. Printing system 10 includes a stencil 11 having a thickness t, disposed on top of a substrate 14, such as a PCB. A number of apertures 12 are fabricated into stencil 11 based on the position of a number of printing targets 16 on PCB 14.

Printing system 10 also includes a squeegee assembly 18 having squeegee blade holder 19. A fastener (not illustrated), such as a damper may be used to secure a profile squeegee blade 20 to squeegee blade holder 19. During use, a printing edge 21 of profile squeegee blade 20 is put in contact with stencil 11 at an angle θ. Profile squeegee blade 20 also includes a number of profile features 22, more clearly illustrated in FIG. 2.

To deposit printing material onto printing targets 16, a mass of printing material 24 is deposited by a dispenser (not illustrated), onto stencil 11. Printing material 24 may include solder paste, epoxy, or other conductive adhesives, such as silver paste. For exemplary purposes, the printing material 24 is described as being solder paste.

Squeegee assembly 18 then moves profile squeegee blade 20 as indicated by the arrow, spreading solder paste 24 across stencil 11. As printing edge 21 of profile squeegee blade 20 moves by, each aperture 12 is filled with solder paste 24. Finally, solder paste 24 passes through each aperture 12 and deposits onto the respective targets 16.

Figure 2:
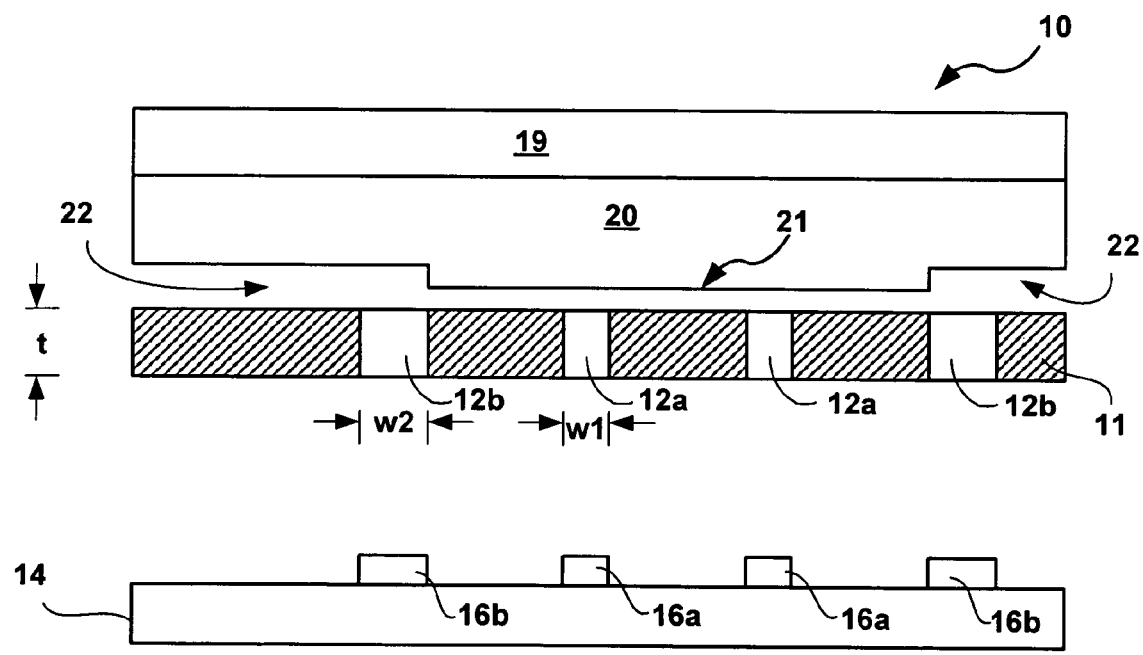
FIG. 2 illustrates a frontal cross-section of the printing system in accordance with embodiments of the present invention.

FIG. 2 illustrates a frontal cross-section of printing system 10 in accordance with embodiments of the present invention. PCB 14 includes a number of fine pitch targets 16a and a number of large pitch targets 16b. The targets are aligned with apertures 12a and 12b, having widths $w_1$ and $w_2$, on stencil 11. Fine pitch target 16a is typically used to attach fine pitch components such as semiconductor chips, QFPs, and SDRAM pads. Large pitch target 16b may be used to attach large pitch components, such as input/output (I/O) connector pads and tantalum capacitor pads. Large pitch components typically have a surface area ranging from about 10,000 mils$^2$ to about 25,000 mils$^2$.

As described above, fine pitch targets 16a must, not receive excessive amounts of solder paste 24, otherwise a short circuit may be created between adjacent targets. The width $w_1$ of apertures 12a may be decreased to reduce the solder paste volume, however the aperture should maintain a height (equal to stencil thickness) to width ratio not less than about 1.5.

If width $w_1$ is designed below then 1.5 ratio, solder paste 24 may stick to the aperture walls and may not deposit to the printing target. Therefore, stencils with a reduced thickness t, must be used to avoid depositing too much solder paste 24 onto fine pitch targets 16a. For example, for most fine pitch targets 16a, stencil thickness t is about 4 mils to about 5 mils thick.

Unfortunately, because stencils are limited to deliver even printing of solder paste, stencils with a reduced thickness t for fine pitch targets 16 may not be able to form apertures 12b that are large enough to deposit an adequate volume of solder paste 24 onto large pitch targets 16b. If not enough solder paste is deposited, large pitch components may not be attached securely to large pitch targets 16b. To deliver adequate solder volume to large pitch targets 16b, profile squeegee blade 20 is formed with profile features 22 that are aligned with apertures 12b. In this particular example, profile features 22 are rectangular and may be referred to as step design profile features.

Figure 3:
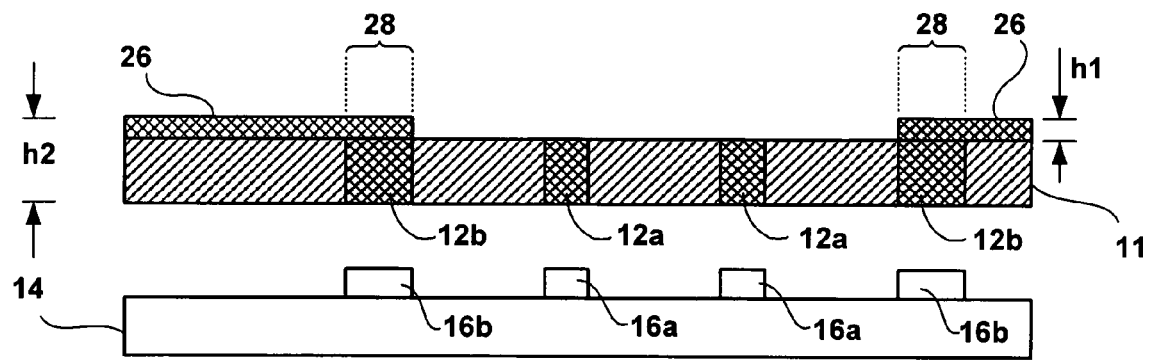
FIG. 3 illustrates the stencil having layers of solder paste deposited on top of the selected apertures in accordance with embodiments of the present invention.

FIG. 3 illustrates stencil 11 having layers of solder paste 26 deposited on top of selected apertures 12b in accordance with embodiments of the present invention. As squeegee assembly 18 moves profile squeegee blade 20, it spreads solder paste 24 across stencil 11 and into apertures 12a and 12b. However, because profile features 22 are aligned with apertures 12b, layers of solder paste 26 are deposited on top of apertures 12b. The deposition of solder paste layers 26 results in a paste height gain h.sub.1 and an overall paste height of h.sub.2 from solder paste portions 28 deposited above apertures 12b.

Figure 4:
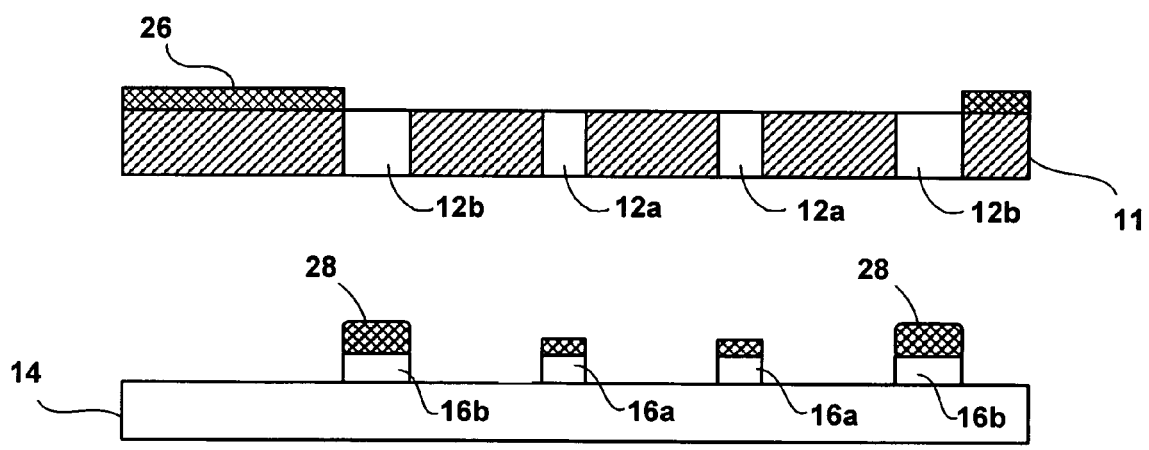
FIG. 4 illustrates the stencil and the PCB after solder paste deposition in accordance with embodiments of the present invention.

FIG. 4 illustrates stencil 11 and PCB 14 after solder paste deposition in accordance with embodiments of the present invention. Solder paste portions 28 pass through apertures 12b and deposit onto large pitch targets 16b, resulting in a gain of paste deposition volume. The additional paste deposited by the claimed invention reduces the number of defects and errors in the PCBA process by ensuring that large pitch components will be properly secured to large pitch targets 16b. Furthermore, the claimed invention enables the deposition of solder paste on both large and fine pitch targets 16a and 16b in a single operation.

The percentage of volumetric gain of solder paste from a profile squeegee blade may be controlled by adjusting variables such as, the area of profile features on the blade, the angle θ between the squeegee blade to the normal of the stencil surface, the thickness of the stencil, and the print length. More specifically:

| PERCENTAGE OF VOLUMETRIC GAIN OF SOLDER PASTE |
| --- |
| ≈ [EXPECTED PASTE HEIGHT GAIN (PROFILE SQUEEGEE) * PRINT LENGTH] /[STENCIL THICKNESS * PRINT LENGTH] |
| ≈ [HEIGHT OF PROFILE FEATURE DESIGN * COS θ * PRINT LENGTH] /[THICKNESS OF STENCIL * PRINT LENGTH] |

Thus, in a printing system where print angle is 70°, stencil thickness is 6 mils, height of profile feature is 8 mils, and the print length is 124 mils, the percentage volumetric gain would be about 45.6%.

The step design profile squeegee blade provides volumetric gain of solder paste deposition with an even distribution, mirroring the step design. However, such even distribution may result in solder paste bridging for certain electrical components supported by a PCB. In one example, insertion of a straddle mount connector may cause solder smearing, which could lead to solder bridging after reflow. To avoid these problems, the profile features of the claimed invention may be designed to control not only the volumetric gain, but also the distribution and the final shape of the solder paste deposition.

Figure 5:
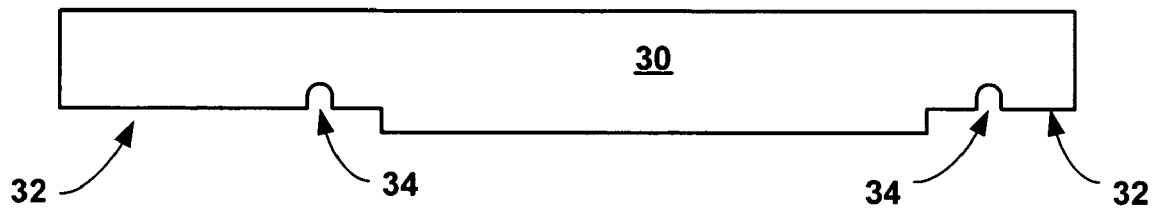
FIG. 5 illustrates a profile squeegee blade having a notch cut design in accordance with embodiments of the present invention.

FIG. 5 illustrates a profile squeegee blade 30 having a notch cut design in accordance with embodiments of the present invention. Profile squeegee blade 30 includes a pair of step profile features 32 and a pair of notch profile features 34. In these embodiments, notch profile features 34 are formed in a semi-circle design, thus the added area may be calculated by .pi.r.sup.2/2. As described with reference to FIGS. 1-4, step profile features 32 will provide for a volumetric gain in solder paste deposition. Notch profile features 34 provide even greater solder paste height, but are specially designed to allow a printing system to deposit a mass of solder paste with a hump like shape.

Figure 6:
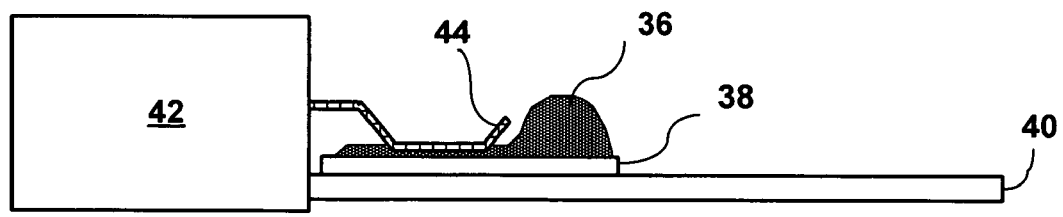
FIG. 6 illustrates a solder paste hump formed onto a connector pad of the PCB in accordance with embodiments of the present invention.

FIG. 6 illustrates a solder paste hump 36 formed onto a connector pad 38 of PCB 40 in accordance with embodiments of the present invention. After solder paste hump 36 has been deposited, a straddle mount connector 42 having connector leads 44 may be inserted into contact with connector pad 38. By forming solder paste hump 36, notch profile features 34 provides for additional solder volume for connector pad 38.

Because the excess solder paste is deposited at the end of the connector pad 38, solder paste hump 36 will not come into contact with connector lead 44, thus preventing any smearing from occurring when connector lead 44 is inserted. After melting, the excess solder paste from hump 36 will reflow to secure straddle mount connector 42 to connector pad 38. Thus, the claimed invention provides for additional solder volume gain for straddle mount connectors with no impact on solder bridging.

Figure 7:
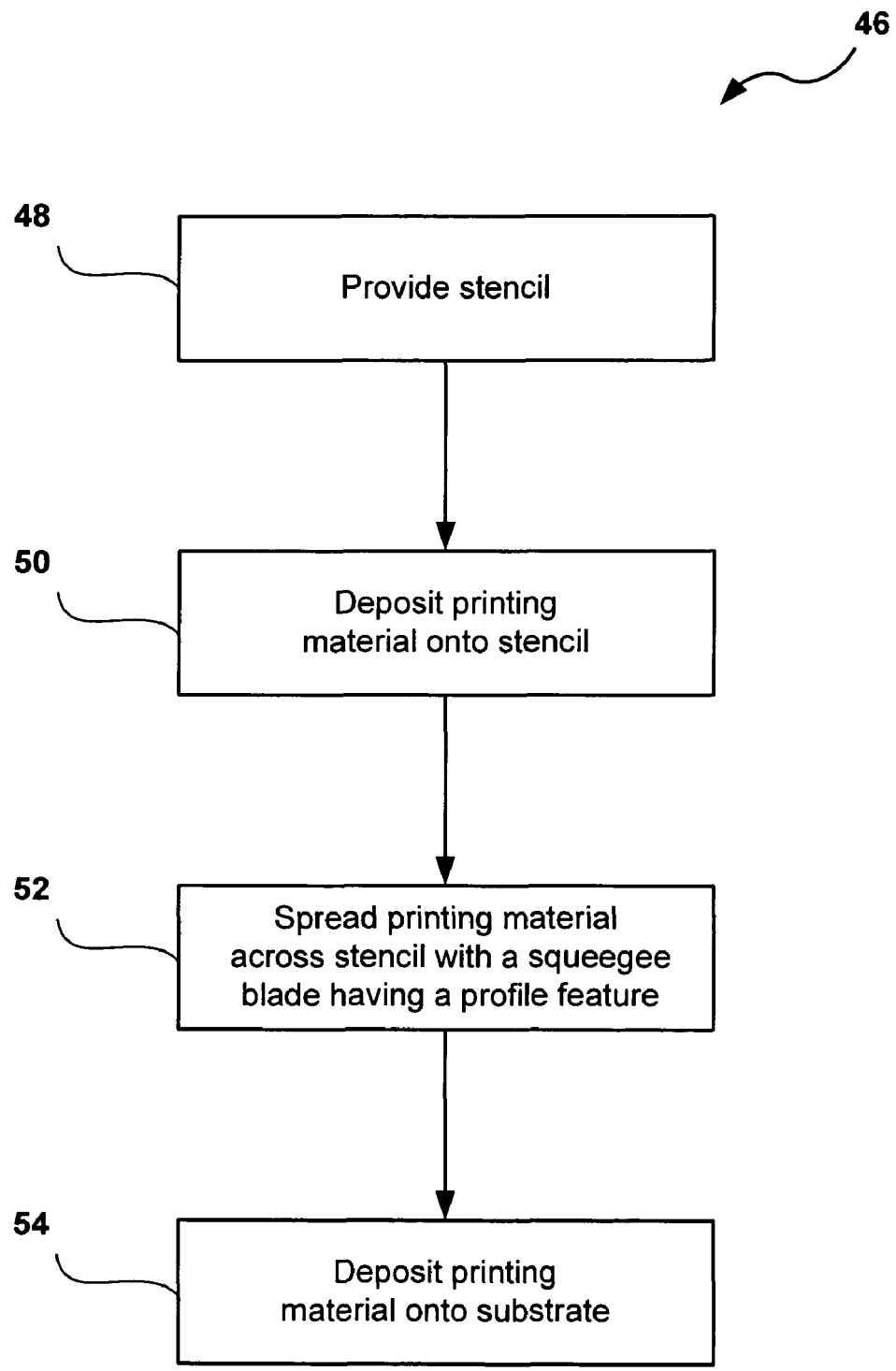
FIG. 7 is a flow chart of a method for depositing a printing material on a substrate in accordance with embodiments of the present invention.

FIG. 7 is a flow chart of a method 46 for depositing a printing material on a substrate in accordance with embodiments of the present invention. Method 46 begins at an act 48, in which a stencil having a plurality of apertures therethrough is provided. The stencil is disposed adjacent to the substrate so that the apertures are aligned with a number of printing targets on the substrate.

In act 50, the printing material, typically a mass of solder paste, is deposited onto the stencil. A squeegee blade having a profile feature is then moved to spread the printing material across the stencil in an act 52. The profile feature increases a volume of the printing material spread across the stencil. Thus, when the additional printing material passes through the apertures to deposit onto the substrate in an act 54, method 46 results in a volumetric gain of printing material. The squeegee blade may be formed to accommodate various shapes and volumes required by the PCB, for example, such as a step design, a notch design, or both.

One advantage of the claimed invention is that it enables a conventional printing system to increase solder paste deposition without increasing the thickness of a stencil. Profile features of varying shapes and sizes may be designed into each profile squeegee blade to selectively increase solder paste volume and distribution. This improved control over solder paste deposition increases the probability that electronic components are properly secured to PCBs and reduces the probability of short circuits. In fact, test results show that the claimed invention reduces DPPM by over 75%.

Another advantage of the claimed invention is that it provides for precise solder paste deposition for both large and fine pitch electrical components. The claimed invention requires only one stencil to print to components having great disparity in size and shape. Therefore, PCBA may be completed in a single operation, which reduces the cost and increases the speed of the process.

Other embodiments of the invention will be apparent to those skilled in the art from consideration of the specification and practice of the claimed invention. Furthermore, certain terminology has been used for the purposes of descriptive clarity, and not to limit the claimed invention. The embodiments and preferred features described above should be considered exemplary, with the claimed invention being defined by the appended claims.

What is claimed is:

1. A method for depositing a printing material on a substrate, comprising:
    depositing the printing material onto a stencil defining a first aperture and a different size second aperture adjacent to the substrate; and
    spreading the printing material across the stencil with a squeegee blade operably defining a non-constant spatial disposition from a surface of the stencil facing the squeegee blade, the non-constant spatial disposition formed by a linear edge of the squeegee blade at a predetermined spatial disposition that is sized in relation to the size of the first aperture and operably aligned with the first aperture and a profile feature of the squeegee blade contiguous with the linear edge at a different predetermined spatial disposition that is sized in relation to the size of the second aperture and operably aligned with the second aperture, so that the amount of the printing material operably delivered to the surface of the stencil facing the squeegee blade varies in direct relation to the non-constant spatial disposition between the squeegee blade and the surface of the stencil facing the squeegee blade.

2. The method as recited in claim 1, wherein the profile feature is formed by a step design.

3. The method of claim 1, wherein the profile feature is formed by a notch cut design.

4. The method of claim 3 wherein the notch cut design is characterized as being arcuate.

5. The method as recited in claim 1 comprising securing a straddle mount connector pad to the substrate via the printing material.

6. The method as recited in claim 1, wherein the stencil has a thickness ranging from about 4 mils to about 5 mils.

7. The method as recited in claim 6, wherein the stencil defines a plurality of apertures each having a height to width ratio of not less than about 1.5.

8. The method as recited in claim 7, wherein the plurality of apertures are used to deposit printing material for large pitch components, wherein the large pitch components have a surface area ranging from about 10,000 $mils^2$ to about 25,000 $mils^2$.

9. A printing device for depositing a printing material on a substrate, comprising a squeegee blade for spreading the printing material onto a stencil defining a first aperture and a different size second aperture adjacent to the substrate, the squeegee blade operably defining a non-constant spatial disposition from a surface of the stencil facing the squeegee blade, the non-constant spatial disposition formed by a linear edge of the squeegee blade at a predetermined spatial disposition that is sized in relation to the size of the first aperture and operably aligned with the first aperture and a profile feature of the squeegee blade contiguous with the linear edge at a different predetermined spatial disposition that is sized in relation to the size of the second aperture and operably aligned with the second aperture, to operably spread the printing material onto the surface of the stencil facing the squeegee blade in different amounts that vary in direct relation to the non-constant spatial disposition between the squeegee blade and the surface of the stencil facing the squeegee blade.

10. The printing device of in claim 9, wherein the profile feature is formed by a step design.

11. The printing device as recited in claim 9 wherein the profile feature is formed by a notch cut design.

12. The printing device of claim 11 wherein the notch cut design is characterized as being arcuate.

13. The printing device as recited in claim 9, wherein the stencil has a thickness ranging from about 4 mils to about 5 mils.

14. The printing device of claim 9, wherein the stencil defines a plurality of apertures each having a height to width ratio of not less than about 1.5.

15. The printing device of claim 14, wherein the plurality of apertures are used to deposit printing material for large pitch components, wherein said large pitch components have a surface area ranging from about 10,000 $mils^2$ to about 25,000 $mils^2$.

16. The printing device of claim 9 wherein the profile feature defines the different second spatial disposition in relation to and aligned with a plurality of second apertures.

17. The printing device of claim 16 wherein the plurality of second apertures are adjacent to each other.

18. The printing device of claim 9 wherein the spatial disposition is related to a pitch with which components are to be mounted on the substrate via the printing material.

\* \* \* \* \*